United States Patent
Tao

(10) Patent No.: US 6,667,701 B1
(45) Date of Patent: Dec. 23, 2003

(54) VARIABLE LENGTH DECODER

(75) Inventor: Jianping Tao, Cedar Park, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/196,532

(22) Filed: Jul. 16, 2002

(51) Int. Cl.$^7$ ................................................ H03M 7/40
(52) U.S. Cl. .......................................... 341/67; 341/51
(58) Field of Search ............................... 341/67, 50, 51

(56) References Cited

U.S. PATENT DOCUMENTS

| 5,798,718 A | * | 8/1998 | Hadady ........................ 341/51 |
| 6,229,460 B1 | * | 5/2001 | Tsai et al. ..................... 341/67 |
| 2001/0030615 A1 | | 10/2001 | Zhou | |

FOREIGN PATENT DOCUMENTS

WO    WO 01/93595 A2    12/2001

OTHER PUBLICATIONS

Budagavi et al., "Wireless MPEG–4 Video Communication on DSP Chips," IEEE Signal Processing Magazine, Jan. 2000, pp. 36–53.

Talluri, "Error–Resilient Video Coding in the ISO MPEG–4 Standard," IEEE Communications Magazine, Jun. 1998, pp. 112–119.

Novell et al., "VLSI Implementation of a Reversible Variable Length Encoder/Decoder," IEEE, 1999, pp. 1969–1972.

Molloy et al., "Low Power VLSI Architectures for Variable–Length Encoding and Decoding," IEEE, 1997, pp. 997–1000.

* cited by examiner

*Primary Examiner*—Brian Young
*Assistant Examiner*—Joseph J Lauture
(74) *Attorney, Agent, or Firm*—Susan C. Hill

(57) ABSTRACT

A variable length decoder (200) detects the class of a codeword in a bit stream (332). If the codeword is first class, a first set of encoding rules are used to generate a pointer "C A B" into a table to retrieve table content (250), where the values of "C", "A", and "B" are determined from the codeword. If the codeword is second class, a second set of encoding rules are used to generate a pointer "0 (C+X) Z" into a table to retrieve table contents (252), where the values of "C" and "Z" are determined from the codeword and the value of "X" is a predetermined value. The code length of each codeword is calculated while the pointer is being generated, and thus the code length does not have to be stored in memory (204).

33 Claims, 6 Drawing Sheets

VARIABLE LENGTH DECODER

FIELD OF THE INVENTION

The present invention relates to a decoder, and more particularly to a variable length decoder.

BACKGROUND OF THE INVENTION

Many video applications utilize data compression. More particularly, many video applications utilize transform code compressed domain formats, which include the Discrete Cosine Transform (DCT) format, the interframe predictive code format, such as the Motion Compensation (MC) algorithm, and hybrid compressed formats. The combination of Motion Compensation and Discrete Cosine Transform is used in a number of protocol standards, including Moving Picture Expert Group (MPEG) standards MPEG-1, MPEG-2, MPEG-4, and International Telecommunication Union (ITU) standards H.261, and H.263.

Referring to FIG. 1, many standard video protocols (e.g. MPEG-1) use variable length coding. However, if variable length coding is used and one or more errors occur in the bit stream due to channel errors, all data between the resynchronization markers is usually discarded.

Referring to FIG. 2, in order to improve performance in an error-prone environment like wireless applications, reversible variable length code is used in some video protocols (e.g. MPEG-4) for coding DCT data. Since the reversible variable length code can be decoded in both directions, forward and reverse, it can be used to recover more DCT data from a corrupted bit stream. When a reversible variable length decoder meets errors in the forward direction, the reversible variable length decoder can jump to the next resynchronization marker and perform decoding in the reverse direction. Thus, comparing FIGS. 1 and 2, the reversible variable length decoder can recover some of the data (see FIG. 2) which would have been discarded if a non-reversible variable length decoder was used (see FIG. 1)

BRIEF DESCRIPTION OF THE DRAWINGS

The present invention is illustrated by way of example and not limited by the accompanying figures, in which like references indicate similar elements, and in which.

Figure 1:
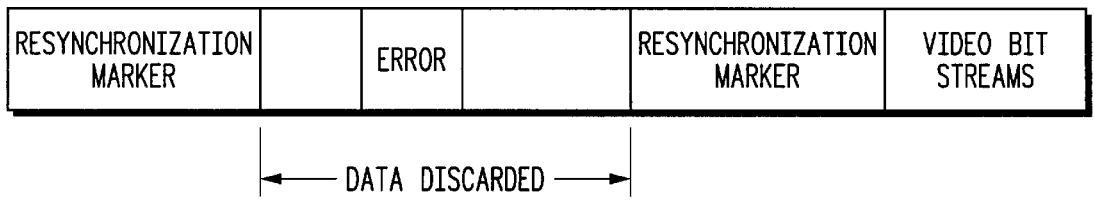
FIG. 1 illustrates, in block diagram form, a bit stream which uses variable length code and which contains an error in accordance with the prior art.
Figure 2:
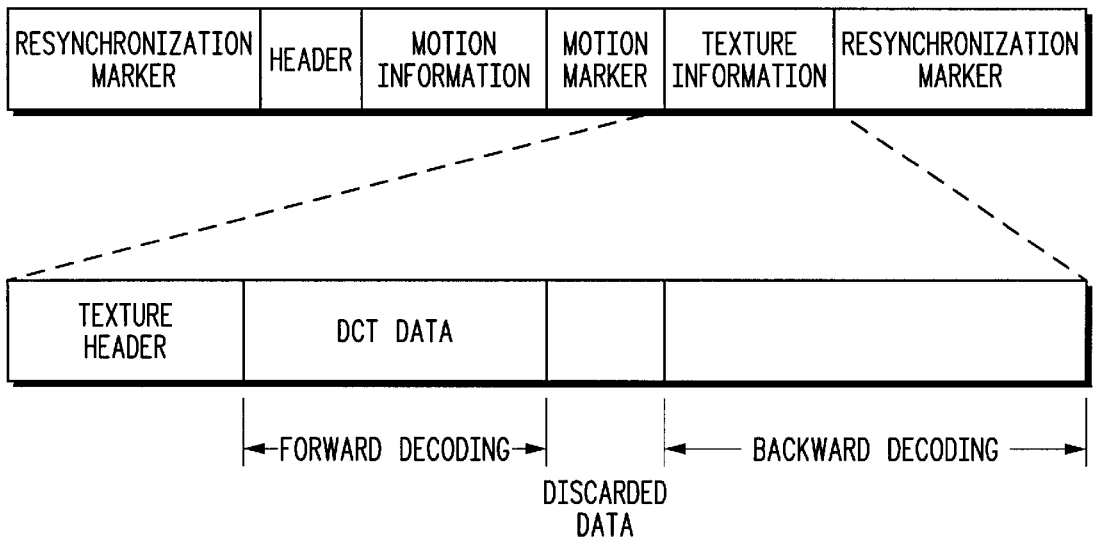
FIG. 2 illustrates, in block diagram form, a bit stream which uses reversible variable length code and which contains an error in accordance with the prior art.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. Brackets are used to indicate the conductors of a bus or the bit locations of a value. For example, "bus 60 [0–7]" or "conductors [0–7] of bus 60" indicates the eight lower order conductors of bus 60, and "address bits [0–7]" or "ADDRESS [0–7]" indicates the eight lower order bits of an address value.

The present invention recognizes that codewords may be divided into a plurality of classes based on one or more characteristics. In one embodiment of the present invention, a reversible variable length decoder 200 (see FIGS. 6 and 7) detects the class of a codeword in a bit stream 332. If the codeword is first class, a first set of encoding rules are used to generate a binary pointer "C A B" into a table to retrieve table content 250 (see FIG. 8). Table content 250 may be stored in memory 204 or in some other location of data processing system 10 (see FIG. 6), where the values of "C", "A", and "B" are determined from the codeword. If the codeword is second class, a second set of encoding rules are used to generate a binary pointer "0 (C+X) Z" into a table to retrieve table contents 252 (see FIG. 8) stored in memory 204 (see FIG. 6), where the values of "C" and "Z" are determined from the codeword and the value of "X" is a predetermined value. The code length of each codeword is calculated while the pointer is being generated, and thus the code length does not have to be stored in memory 204. Note that the labels "A", "B", "Z", and "X" as used herein have no special meaning and may be replaced by any type of label. The label "S" was chosen because it refers to a bit that functions as a sign bit for a codeword; however, alternate embodiment of the present invention may use any labels for the values common to a class.

Figure 7:
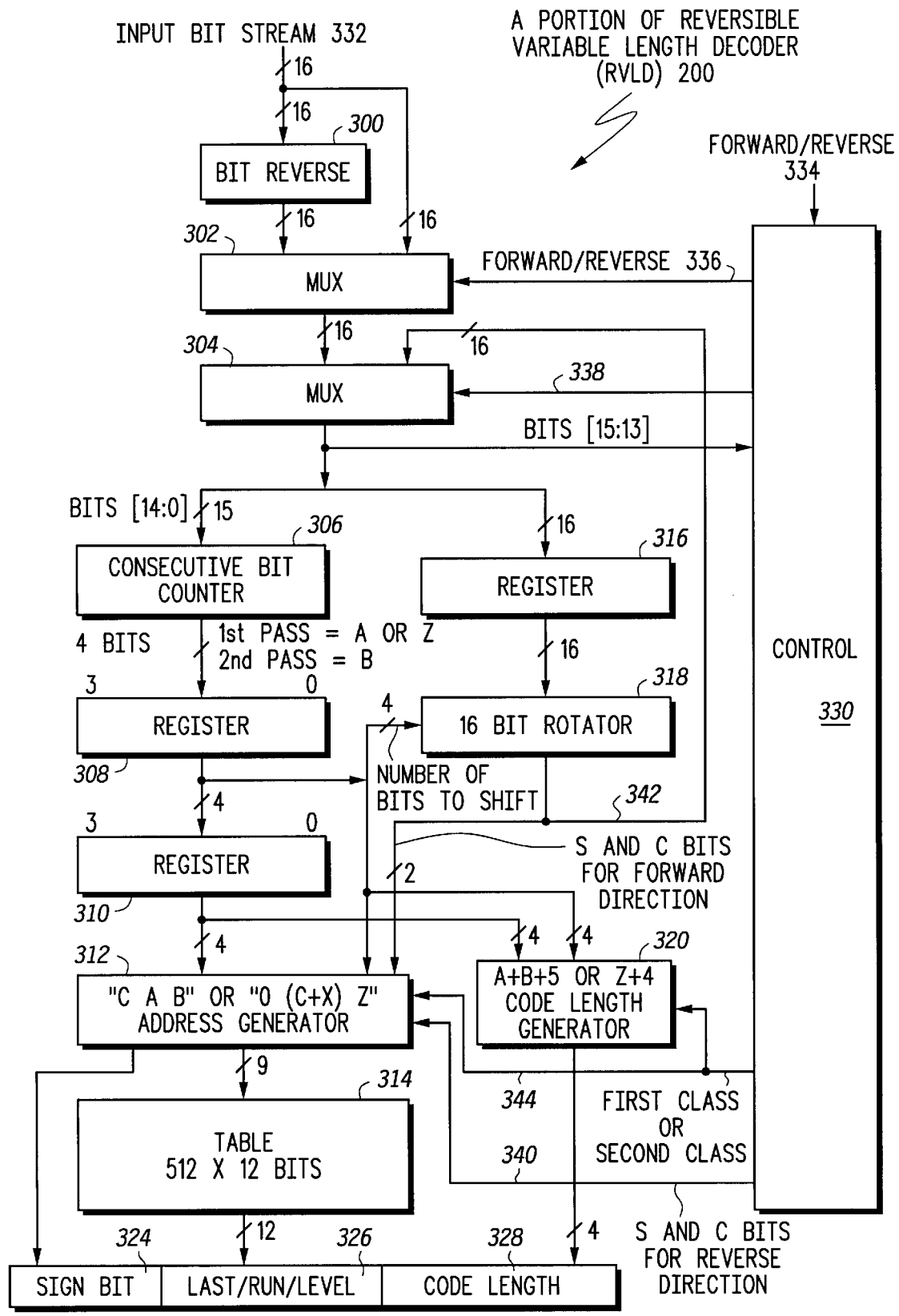
FIG. 7 illustrates, in block diagram form, a portion of reversible variable length decoder 200 of FIG. 6 in accordance with one embodiment of the present invention.
Figure 8:
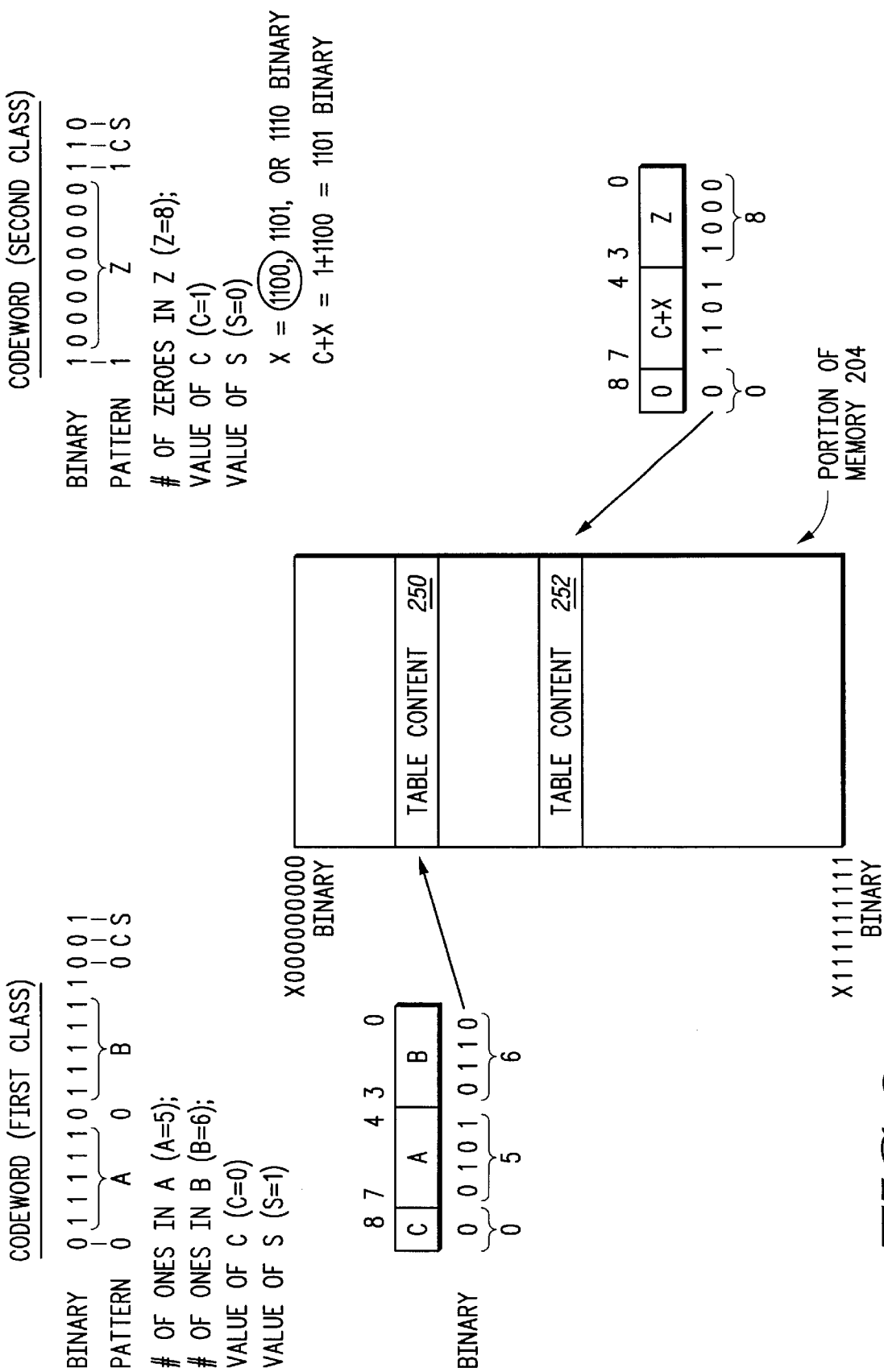
FIG. 8 illustrates, in block diagram form, an example of how reversible variable length decoder 200 of FIG. 7 may be used to generate pointer addresses from codewords in accordance with one embodiment of the present invention.

FIG. 8 illustrates an example of how reversible variable length decoder 200 of FIG. 7 may be used to generate pointer addresses from codewords in accordance with one embodiment of the present invention. For this example, two sample codewords are used, one for each of the two classes. For the first class, codeword 0111110111111001 binary is used; and for the second class, codeword 1000000000110 binary is used. Note that bit 15 of a codeword, namely the first bit in the forward direction, can be used to determine which class the codeword belongs to. If bit 15 is a 0, the codeword is in the first class; and if bit 15 is a 1, the codeword is in the second class. Alternate embodiments of the present invention may use additional or different characteristics of codewords to separate them into a plurality of classes.

Pointer generation for the first class codeword 0111110111111001 binary will be described first. A first class codeword always has the pattern 0A0B0CS, where A equals the number of binary ones between the first and second zeroes in the forward direction (A equals 5 decimal or 0101 binary for the sample codeword), B equals the number of binary ones between the second and third zeroes in the forward direction (B equals 6 decimal or 0110 binary for the sample codeword), C equals the value of the bit following the third zero (C equals 0 for the sample codeword), and S equals the value of the bit following the C bit (S equals 1 for the sample codeword). Note that in binary form, A is 4 bits in length, B is 4 bits in length, C is 1 bit in length, and S is 1 bit in length. The sign bit is not used in generating the pointer address. The values of A, B, and C are reordered into the order C, A, and B and are concatenated to form a 9 bit value "C A B", where C is 1 bit, A is 4 bits, and B is 4 bits. For the sample codeword, the concatenation "C A B" is 001010110 binary, which is then used as a pointer into a portion of memory 204 to retrieve table content 250. Referring to FIG. 7, in one embodiment, table content 250 comprises last/run/level 326 without sign bit 324 and code length 328.

Pointer generation for the second class codeword 100000000110 binary will now be described. A second class codeword always has the pattern 1Z1CS, where Z equals the number of binary zeroes between the first and second ones in the forward direction (Z equals 8 decimal or 1000 binary for the sample codeword), C equals the value of the bit following the second one (C equals 1 for the sample codeword), and S equals the value of the bit following the C bit (S equals 0 for the sample codeword). Note that in binary form, Z is 4 bits in length, C is 1 bit in length, and S is 1 bit in length. The sign bit is not used in generating the pointer address. In order to ensure that none of the pointer addresses for the second class are the same as any pointer address for the first class, a predetermined number X (e.g. 1100, 1101, or 1110 binary) is added to C in order to offset the second class pointers by a predetermined amount. In the example illustrated in FIG. 8, the predetermined offset value X added to C was selected to be 1100 binary. Alternate embodiments of the present invention may use a different offset value X (e.g. 1101 or 1110 binary). The offset value 1100 binary is added to C to produce the result C+X. The values of Z and C+X are reordered into the order C+X and Z and are concatenated with a leading 0 to form a 9 bit value "0 (C+X) Z", where 0 is 1 bit, (C+X) is 4 bits, and Z is 4 bits. For the sample codeword, the concatenation "0 (C+X) Z" is 011011000 binary, which is then used as a pointer into a portion of memory 204 to retrieve table content 252. Referring to FIG. 7, in one embodiment, table content 252 comprises last/run/level 326 without sign bit 324 and code length 328.

Note that the codewords 00010 binary and 00011 binary are considered to be first class and result in A=0, B=0, C=1, and S=0 and 1 respectively. Note that the codewords 1110 binary and 1111 binary are considered to be second class and result in Z=0, C=1, and S=0 and 1 respectively.

Figure 6:
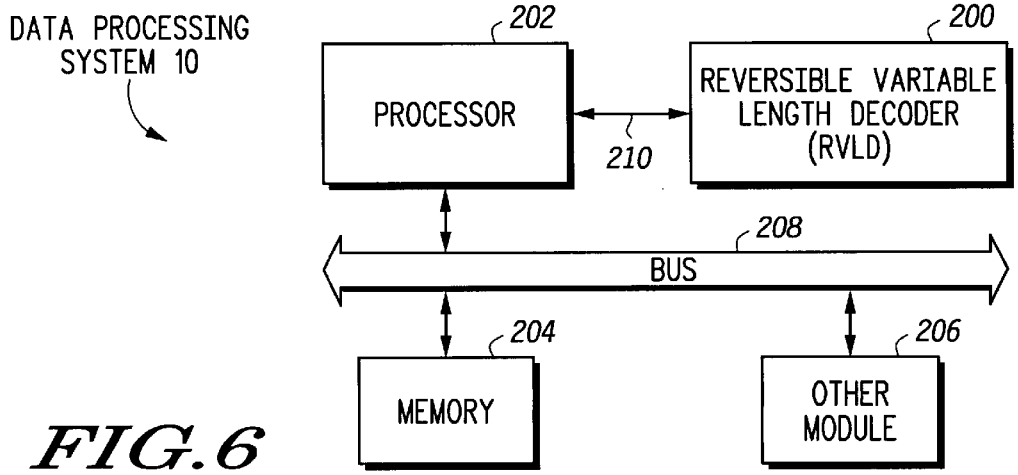
FIG. 6 illustrates, in block diagram form, a data processing system 10 in accordance with one embodiment of the present invention.

FIG. 7 illustrates a portion of reversible variable length decoder 200 of FIG. 6 in accordance with one embodiment of the present invention. Although the illustrated embodiment assumed a maximum codeword length of 16 bits, alternate embodiments of the present invention may use any maximum length for codewords. In the illustrated embodiment, the next 16 bits of input bit stream 332 are input to bit reverse circuitry 300 and are also input to multiplexer (MUX) 302. Bit reverse circuitry 300 simply reverses the bit ordering of the 16-bits received from the input bit stream 332. MUX 302 selects whether the reversed or non-reversed 16 bits are passed through to MUX 304. Control circuitry 330 receives a forward/reverse signal 334 which indicates whether decoder 200 is operating in the forward or reverse direction. Control circuitry 330 then provides a forward/reverse control signal 336 to MUX 302. Control circuitry 330 also provides a control signal 338 to MUX 304 which selects the output of MUX 302 for the first pass through consecutive bit counter 306 and which selects the output of 16-bit rotator 318 for the second pass through consecutive bit counter 306. Note that 16-bit rotator 318 and register 316 may be implemented as a 16-bit shift register.

The 16-bit output of MUX 304 is provided to register 316, bits [14:0] from MUX 304 are provided to consecutive bit counter 306, bits [15:14] from MUX 304 are provided to address generator 312, and bits [15:13] from MUX 304 are provided to control circuitry 330. Control circuitry uses bit [15] in the forward direction to determine whether a codeword is first class or second class. In the reverse direction, control circuitry uses bit [13] to determine whether a codeword is first class or second class. Regardless of class, control circuitry 330 uses bit [14] in the reverse direction to determine the value of C in the codeword. Once it has determined the value of C for the reverse direction, i.e. from bit [14], control circuitry 330 provides the value of C to address generator 312 by way of conductor 340.

Consecutive bit counter 306 counts consecutive ones or zeroes. Note that the consecutive bit counter 306 can be implemented in a wide variety of ways. In one implementation, consecutive bit counter 306 counts how many consecutive bits are the same binary value as the leading bit, regardless of whether the leading bit is a binary 0 or a binary 1. Note that for the illustrated embodiment of the present invention, the leading bit is included in the consecutive bit count. Alternate embodiments of the present invention may perform the bit count in other ways.

In one embodiment of the present invention, for the first pass through consecutive bit counter 306, consecutive bit counter 306 is counting the number of consecutive ones in "A" for first class codewords, and is counting the number of consecutive zeroes in "Z" for second class codewords. Consecutive bit counter 306 outputs a 4-bit binary value representing the number of consecutive ones or zeros that were counted (A or Z) which is then stored in register 308. This count value (A or Z) is also provided from the output of register 308 to 16-bit rotator 318. 16-bit rotator 318 uses the count value to determine how many bits to rotate left or shift left. Once the rotate or shift left has completed, for second class codewords in the forward direction, the leading bit, bit [15], is now the C bit. The next bit, bit [14] is the sign bit S. The C bit and the S bit are provided from 16-bit rotator 318 to address generator 312 by way of conductors 342. Address generator 312 uses the count value from the first pass to determine the value of Z for second class codewords.

After 16-bit rotator 318 has performed the rotate or shift left, the shifted result is fed back into the input of MUX 304. Now for the second pass, control circuitry 330 selects the output of 16-bit rotator 318 as the output of MUX 304. Consecutive bit counter 306 counts consecutive ones or zeroes. For the second pass through consecutive bit counter 306, consecutive bit counter 306 is counting the number of consecutive ones in "B" for first class codewords, and there is no need for a second pass for second class codewords. Consecutive bit counter 306 outputs a 4-bit binary value representing the number of consecutive ones that were counted (B) which is then stored in register 308. Note that when B is stored in register 308, the previously stored value of A in register 308 is moved to register 310. The count value (B) is provided from the output of register 308 to 16-bit rotator 318 to determine how many bits to rotate left or shift left. Once the rotate or shift left has completed, for first class codewords in the forward direction, the leading bit, bit [15], is now the C bit. The next bit, bit [14] is the sign bit S. The C bit and the S bit are provided from 16-bit rotator 318 to address generator 312 by way of conductors 342.

Address generator 312 generates a pointer value which is used to select an entry in table 314. For first class codewords in the forward direction, address generator 312 receives the value C from 16-bit rotator 318, the value A from register 310, and the value B from register 308. For first class codewords in the reverse direction, address generator 312 receives the value C from control circuitry 330, the value B from register 310, and the value A from register 308. For second class codewords in the forward direction, address generator 312 receives the value Z from register 308 and receives the value C from 16-bit rotator 318. For second class codewords in the reverse direction, address generator 312 receives the value Z from register 308 and the value C from control circuitry 330. For first class codewords, address generator 312 concatenates the values C, A, and B to generate the 9-bit pointer address (see FIG. 8). For second class codewords, address generator 312 concatenates the values binary 0, C+X, and Z to generate the 9-bit pointer address. Note that in one embodiment of the present invention, X is a predetermined number (e.g. 1100, 1101, or 1110 binary) which offsets the pointers for second class codewords. The reason to offset the pointers for second class codewords is so that these pointers do not have the same value as any pointer for a first class codeword. Alternate embodiments of the present invention may or may not use such an offset. Also, if desired, alternate embodiments of the present invention may offset one or more different values used to form a pointer (e.g. values A, B, Z) in addition to "C" or instead of "C".

Control circuitry 330 provides a control signal 344 which indicated whether the current codeword is first class or second class. Address generator 312 uses control signal 344 to select whether the pointer into table 314 is generated using "C A B" for a first class codeword, or "0 (C+X) Z" for a second class codeword. The generator pointer is used to select an entry in table 314. In one embodiment of the present invention, an entry in table 314 includes last, run, and level information 326 as specified by the MPEG-4 protocol. For the reverse direction, the value of sign bit 324 is provided from bit [15] of the output of bit reverse circuitry 300 and may be routed to sign bit 324 by way of control circuitry 330 and address generator 312. For the forward direction, the value of the sign bit 324 is provided from bit [14] of the output of 16-bit rotator 318 and may be routed to sign bit 324 by way of address generator 312. Alternate embodiments may provide the sign bit value to sign bit 324 using other routing paths.

Note that the code length 328 is not obtained from table 314, but is generated by code length generator 320. Thus, less memory storage is required to implement the present invention since table 314 no longer is required to store code length 328.

For first class codewords, the code length is the value of A plus the value of B plus 5. Again the pattern for a first class codeword is 0A0B0CS. The number five is added to compensate for the three 0's used to delineate A and B, as well as the two bits used to represent C and S. For second class codewords, the code length is the value of Z plus 4. Again the pattern for a second class codeword is 1Z1CS. The number four is added to compensate for the two 1's used to delineate Z, as well as the two bits used to represent C and S.

FIG. 6 illustrates a data processing system 10 in accordance with one embodiment of the present invention. In one embodiment of the present invention, data processing system 10 is implemented on a single integrated circuit. In alternate embodiments of the present invention, data processing system 10 is implemented using a plurality of integrated circuits. In the illustrated embodiment, data processing system 10 includes a reversible variable length decoder (RVLD) 200 which is bi-directionally coupled to processor 202 by way of one or more conductors 210. Processor 202, memory 204, and other module 206 are b-directionally coupled to bus 208. Memory 204 may be any type of device for storing information. Other module 206 is optional and may have any type of functionality. In some applications, processor 202 may not be required. Also, memory 204 may not be required if the codeword table (e.g. table 314 of FIG. 7) is stored in the RVLD 200.

Note that FIG. 6 illustrates just one possible way in which a reversible variable length decoder 200 may be used in a data processing system 10. Many alternate embodiments exist. For example, the RVLD 200 may be incorporated as part of processor 202; the RVLD 200 may be implemented as a coprocessor to processor 202; the RVLD 200 may be coupled to processor 202 by way of a bus 208, rather than by way of one or more separate conductors 210. The functionality of RVLD 200 may be implemented in hardware only, software only, or any combination of hardware and software.

Figure 3:
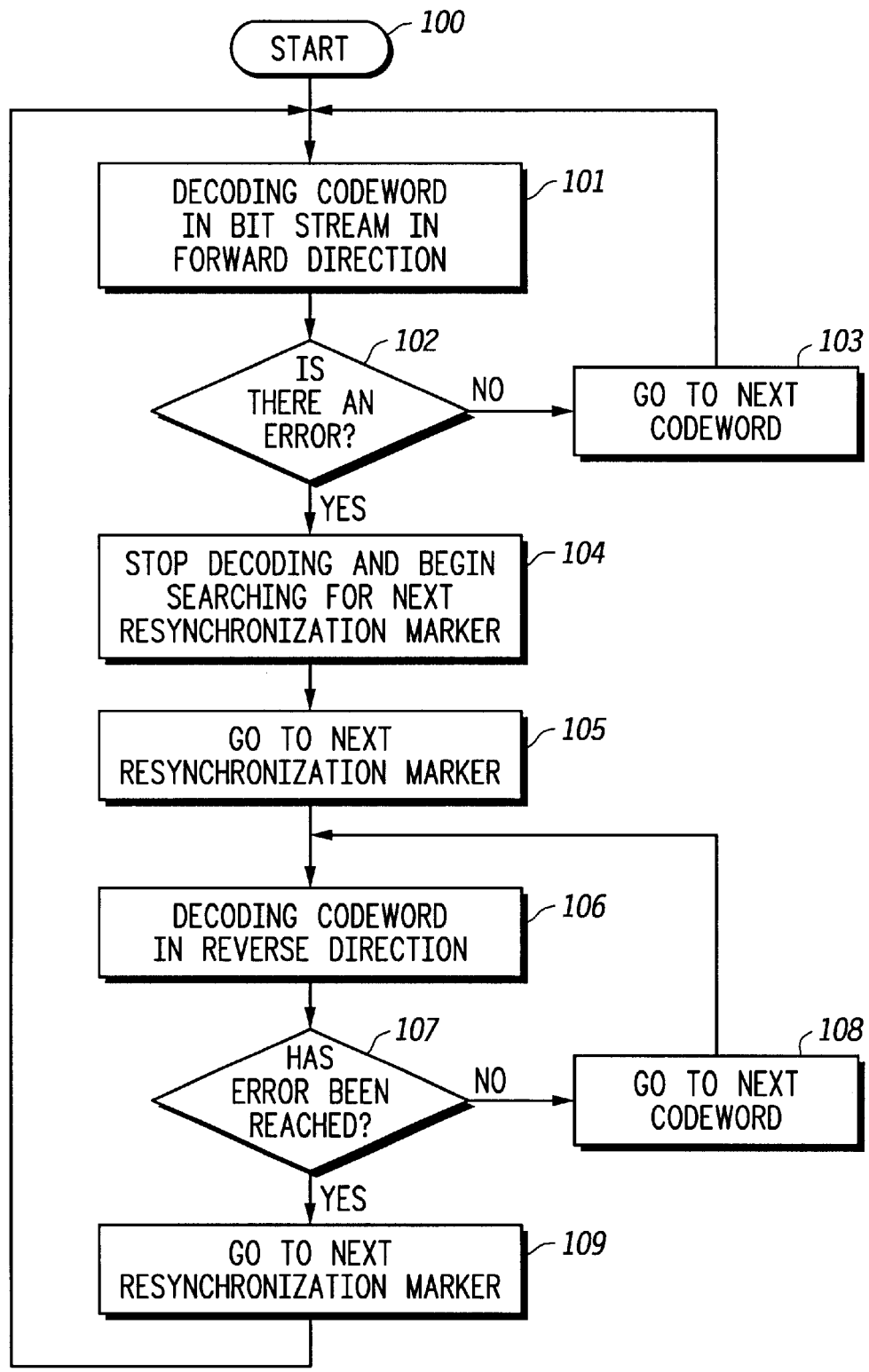
FIG. 3 illustrates, in flow diagram form, a method for performing reversible variable length decoding in accordance with one embodiment of the present invention.

FIG. 3 illustrates, in flow diagram form, a method for performing reversible variable length decoding in accordance with one embodiment of the present invention. The flow starts at oval 100. From oval 100, the flow continues at step 101 with the step of decoding a codeword in the bit stream in the forward direction. From step 101, the flow continues to decision diamond 102 where the question is asked "is there an error?". If there is no error, the flow continues back to the beginning of step 101 where the next codeword is decoded. The flow remains in this loop as long as there is no error and there are more codewords to decode.

If there is an error, the flow continues from decision diamond 102 to step 104 where decoding is stopped and searching for the next resynchronization marker is begun. From step 104, the flow continues to step 105 where the flow goes to the next resynchronization marker. From step 105, the flow continues to step 106 where the codeword is decoded in the reverse direction. From step 106, the flow continues to decision diamond 107 where the question is asked "has error been reached?". If an error has not been reached, the flow continues to step 108 where the flow goes to the next codeword in the reverse direction. From step 108, the flow loops back to step 106 where this next codeword in the reverse direction is decoded. Once an error has been reached per decision diamond 107, the flow continues to step 109 where the flow goes to the next resynchronization marker. Note that an error reached in the reverse direction may be the same error or a different error (e.g. if there are multiple errors) than the error reached in the forward direction. From step 109, the flow returns to the beginning of step 101 where the next codeword in the forward direction is decoded.

Figure 4:
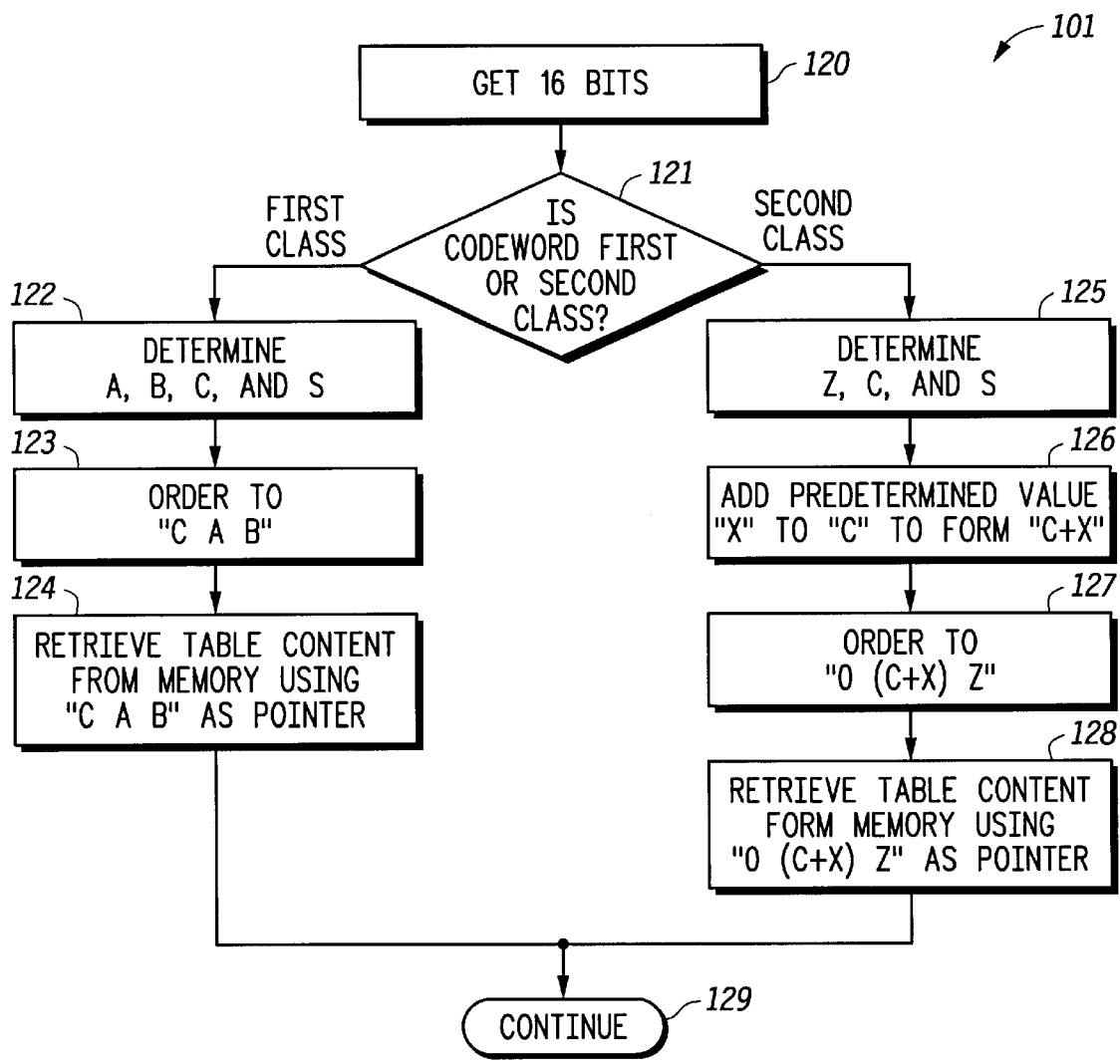
FIG. 4 illustrates, in flow diagram form, a step of decoding a codeword in a bit stream in the forward direction in accordance with one embodiment of the present invention.

FIG. 4 illustrates, in flow diagram form, an expansion of step 101 of the flow diagram of FIG. 3 in accordance with one embodiment of the present invention. The flow starts at step 120 where 16 bits are retrieved or received. Note that in alternate embodiments of the present invention, the number of bits received or retrieved in step 120 may be any number. From step 120, the flow continues to decision diamond 121 where the question is asked "is the codeword first or second class?".

If the codeword is first class, the flow continues from decision diamond 121 to step 122 where the values of A, B, C, and S are determined. From step 122, the flow continues to step 123 where the values of C, A, and B are concatenated in the order "C A B". From step 123, the flow continues to step 124 where the value of "C A B" is used as a pointer to retrieve table contents from memory (e.g. memory 204 in FIG. 6). Alternate embodiments of the present invention may store the table contents in any type of storage device or circuitry; memory is just one such type of storage. From step 124, the flow continues to continue oval 129 which represents the end of step 101. From oval 129, the flow continues to decision diamond 102 of FIG. 3.

If the codeword is second class, the flow continues from decision diamond 121 to step 125 where the values of Z, C, and S are determined. From step 125, the flow continues to step 126 where a predetermined value "X" is added to the value of "C" to form "C+X". From step 126, the flow continues to step 127 where the values "C+X" and Z are concatenated in the order "0 (C+X) Z". From step 127, the flow continues to step 128 where the value of "0 (C+X) Z" is used as a pointer to retrieve table contents from memory (e.g. memory 204 in FIG. 6). Alternate embodiments of the present invention may store the table contents in any type of storage device or circuitry; memory is just one such type of storage. From step 128, the flow continues to continue oval 129 which represents the end of step 101. From oval 129, the flow continues to decision diamond 102 of FIG. 3.

Figure 5:
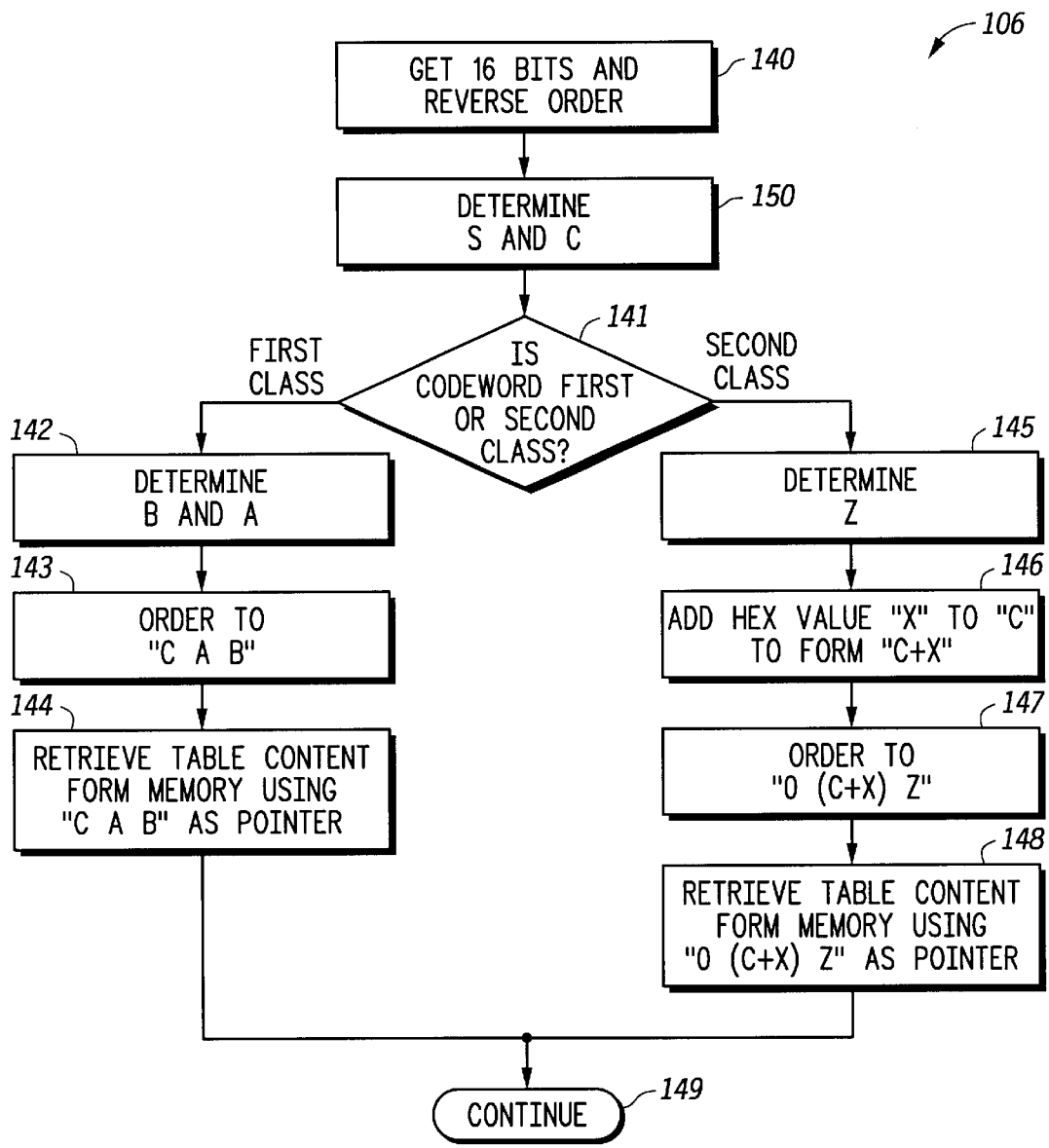
FIG. 5 illustrates, in flow diagram form, a step of decoding the codeword in the reverse direction in accordance with one embodiment of the present invention.

FIG. 5 illustrates, in flow diagram form, an expansion of step 106 of the flow diagram of FIG. 3 in accordance with one embodiment of the present invention. The flow starts at step 140 where 16 bits are retrieved or received and then made accessible in reverse order. Note that in alternate embodiments of the present invention, the number of bits received or retrieved in step 120 may be any number. From step 140, the flow continues to step 150 where the values of S and C are determined. From step 150, the flow continues to decision diamond 141 where the question is asked "is the codeword first or second class?".

If the codeword is first class, the flow continues from decision diamond 141 to step 142 where the values of B and A are determined. From step 142, the flow continues to step 143 where the values of C, A, and B are concatenated in the order "C A B". From step 143, the flow continues to step 144 where the value of "C A B" is used as a pointer to retrieve table contents from memory (e.g. memory 204 in FIG. 6). Alternate embodiments of the present invention may store the table contents in any type of storage device or circuitry; memory is just one such type of storage. From step 144, the flow continues to continue oval 149 which represents the end of step 106. From oval 149, the flow continues to decision diamond 107 of FIG. 3.

If the codeword is second class, the flow continues from decision diamond 141 to step 145 where the value of Z is determined. From step 145, the flow continues to step 146 where a predetermined value "X" is added to the value of "C" to form "C+X". From step 146, the flow continues to step 147 where the values "C+X" and Z are concatenated in the order "0 (C+X) Z". From step 147, the flow continues to step 148 where the value of "0 (C+X) Z" is used as a pointer to retrieve table contents from memory (e.g. memory 204 in FIG. 6). Alternate embodiments of the present invention may store the table contents in any type of storage device or circuitry; memory is just one such type of storage. From step 144, the flow continues to continue oval 149 which represents the end of step 106. From oval 149, the flow continues to decision diamond 107 of FIG. 3.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for determining table content from received data comprising:
   receiving a plurality of bits that include at least one codeword;
   determining a number of a set of consecutive bits in a codeword having a same value; and
   retrieving table content corresponding to the codeword from a memory using a pointer, wherein at least a portion of the pointer is based on the number.

2. The method of claim 1 wherein at least a portion of the pointer includes the number.

3. The method of claim 1 wherein the codeword is encoded in the plurality of bits in a variable length code protocol.

4. The method of claim 3 further comprising:
   calculating a length of the codeword, wherein the calculating includes adding at least a predetermined number to the number to obtain the length of the codeword.

5. The method of claim 1 wherein the codeword is encoded in the plurality of bits in a reversible variable length code protocol.

6. The method of claim 1 further comprising:
   determining the value of a specific bit of the codeword, wherein a portion of the pointer includes the value of the specific bit.

7. The method of claim 1 further comprising:
   determining a number of a second set of consecutive bits in a codeword having the same value, wherein a portion of the pointer is based on the number of the second set.

8. The method of claim 7 further comprising:
   determining the value of a specific bit of the codeword, wherein the pointer includes at least the value of the specific bit, the number of the second set, and the number.

9. The method of claim 1 further comprising:
   determining whether a codeword included in the plurality of bits is at least one of a first class or a second class;
   determining the value of a specific bit of the codeword;
   wherein a portion of the pointer includes the value of the specific bit if the codeword is determined to be of the first class; and
   wherein if the codeword is determined to be of the second class, performing a mathematical operation on the value of the specific bit to obtain a result, wherein a portion of the pointer includes the result.

10. The method of claim 1 further comprising:
determining whether a codeword included in the plurality of bits is at least one of a first class or a second class;
wherein the determining the number further includes:
determining a number of a set of consecutive bits having a first value in a codeword if the codeword is determined to be of the first class; and
determining a number of a set of consecutive bits having a second value in a codeword if the codeword is determined to be of the second class;
wherein the first value is opposite the second value.

11. The method of claim 1 wherein the codeword is encoded in the plurality of bits in a reversible variable length code protocol, the method further comprising:
detecting an error in the plurality of bits; and
finding a next resynchronization marker in the plurality of bits and decoding bits of the plurality of bits preceding the next resynchronization marker in the reverse direction in response to detecting the error.

12. A method of decoding a bit stream of data encoded under a variable length protocol comprising:
receiving a plurality of bits that include at least one codeword;
determining a number of a set of consecutive bits having a same value in a codeword;
retrieving table content corresponding to the code word; and
calculating a length of the codeword utilizing the number.

13. The method of claim 12 further comprising:
determining a number of a second set of consecutive bits having the same value in the codeword, wherein the calculating the length includes utilizing the number of the second set.

14. The method of claim 13 wherein the calculating the length further includes adding a predetermined number to the number and the number of the second set to obtain the length of the codeword.

15. The method of claim 12 wherein the calculating the length further includes adding at least a predetermined number to the number to obtain the length of the codeword.

16. The method of claim 12 further comprising:
determining whether a codeword included in the plurality of bits is at least one of a first class or a second class;
wherein calculating the length of the codeword includes adding at least a first predetermined number to the number if the codeword is determined to be of the first class; and
wherein the calculating the length of the codeword includes adding at least a second predetermined number to the number if the codeword is determined to be of the second class.

17. A decoder comprising:
an input to receive a plurality of bits including at least one codeword;
a consecutive bit counter, the consecutive bit counter configured to determine a number of a set of consecutive bits having the same value in a codeword; and
an address generator coupled to the consecutive bit counter to receive the number, the address generator generating a pointer to a table, wherein at least a portion of the pointer is based on the number.

18. The decoder of claim 17 wherein at least a portion of the pointer includes the number.

19. The decoder of claim 17 wherein the consecutive bit counter provides at an output, a number of consecutive bits, beginning from its leading bit, having the same value as the leading bit.

20. The decoder of claim 17 further comprising:
a code length generator, the code length generator coupled to receive the number, the code length generator generating a length of the codeword, wherein the code length generator utilizes the number to provide the length of the codeword.

21. The decoder of claim 17 further comprising:
bit reverse circuitry selectively coupled to the consecutive bit counter to provide to the consecutive bit counter a plurality of bits in reverse order.

22. The decoder of claim 17 wherein the address generator receives a number of a second set of consecutive bits having the same value in the codeword as determined by the consecutive bit counter, wherein a portion of the pointer is based on the number of the second set.

23. The decoder of claim 22 wherein the address generator receives a value of a specific bit of the codeword, wherein the pointer includes the number, the number of the second set, and the value of the specific bit.

24. The decoder of claim 17 further comprising;
control circuitry, the control circuitry providing an indication of whether a codeword included in the plurality of bits is at least of a first class or a second class, wherein the address generator is coupled to the control circuitry to received the indication;
wherein the address generator is configured to receive a value of a specific bit of the codeword, wherein:
if the indication indicates that the codeword is of the first class, the address generator provides a pointer wherein a portion of the pointer includes the value of the specific bit; and
if the indication indicates that the codeword is of the first class, the address generator provides a pointer wherein a portion of the pointer includes a number obtained from a mathematical operation performed on the value of the specific bit.

25. The decoder of claim 17 further comprising:
control circuitry, the control circuitry providing an indication of whether a codeword included in the plurality of bits is at least of a first class or a second class;
wherein the consecutive bit counter provides a number of a set of consecutive bits having a first value in the codeword if the indication indicates that the codeword is of a first class, wherein the consecutive bit counter provides a number of a set of consecutive bits having a second value in the codeword if the indication indicates that the codeword is of a second class, wherein the first value is opposite the second value.

26. A data processing system including the decoder of claim 17, the system further comprising:
a processor operably coupled to the decoder; and
storage circuitry, the storage circuitry storing the table.

27. The data processing system of claim 26 wherein the decoder is integrated with the processor on an integrated circuit.

28. The data processing system of claim 26 wherein the storage circuitry is located in the decoder.

29. A decoder comprising:
an input to receive a plurality of bits including at least one codeword encoded in a variable length protocol;
a consecutive bit counter, the consecutive bit counter configured to determine a number of a set of consecutive bits having the same value in a codeword;

an address generator, the address generator generating an address to a memory location corresponding to the codeword; and a code length generator, the code length generator coupled to the consecutive bit counter to receive the number, the code length generator generating a length of the codeword, wherein the code length generator utilizes the number to provide the length of the codeword.

30. The decoder of claim 29 wherein the code length generator adds at least a predetermined number to the number to generate the length.

31. The decoder of claim 29 wherein the code length generator receives a number of a second set of consecutive bits having the same value in the codeword as determined by the consecutive bit counter, wherein the code length generator adds at least the number of a second set to the number to generate the length.

32. The decoder of claim 29 wherein the code length generator receives and indication of whether the codeword is determined to be of a first class or of a second class, the code length generator adds at least a first predetermined number to the number to generate the length if the indication indicates that the codeword is of the first class, the code length generator adds at least a second predetermined number to the number to generate the length if the indication indicates that the codeword is of the second class.

33. The decoder of claim 29 wherein the code length generator receives a number of a second set of consecutive bits having the same value in the codeword as determined by the consecutive bit counter, wherein the code length generator adds the number of the second set, the number, and the first predetermined number to generate the length if the indication indicates that the codeword is of the first class.

* * * * *